(12) United States Patent
Takahashi

(10) Patent No.: US 10,134,889 B2
(45) Date of Patent: Nov. 20, 2018

(54) COMPOUND SEMICONDUCTOR DEVICE AND METHOD OF MANUFACTURING THE COMPOUND SEMICONDUCTOR DEVICE

(71) Applicant: FUJITSU LIMITED, Kawasaki-shi, Kanagawa (JP)

(72) Inventor: Tsuyoshi Takahashi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 15/651,854

(22) Filed: Jul. 17, 2017

(65) Prior Publication Data

US 2018/0061973 A1    Mar. 1, 2018

(30) Foreign Application Priority Data

Aug. 25, 2016 (JP) .................. 2016-164679

(51) Int. Cl.
*H01L 29/66* (2006.01)
*H01L 29/778* (2006.01)
(Continued)

(52) U.S. Cl.
CPC ........ *H01L 29/778* (2013.01); *H01L 29/0843* (2013.01); *H01L 29/1058* (2013.01);
(Continued)

(58) Field of Classification Search
USPC ........... 257/94, E21.451, E29.262, E33.008, 257/E21.407, 197, 200, E27.015,
(Continued)

(56) References Cited

U.S. PATENT DOCUMENTS 4,780,748 A * 10/1988 Cunningham .... H01L 21/02395
257/24
7,456,444 B2 * 11/2008 Bito ................... H01L 29/7785
257/192
(Continued)

FOREIGN PATENT DOCUMENTS

EP    0565054    *  6/1993    ........... H01L 29/201
EP    0565054 A2 * 10/1993   ....... H01L 21/28575
(Continued)

OTHER PUBLICATIONS

Matsuoka et al., "Temperature Dependence of Electron Mobility in InGaAs/InAlAs Heterostructures", Japanese Journal of Applied Physics. vol. 29, No. 10, pp. 2017-2025 (9 pages), Oct. 1990.
(Continued)

*Primary Examiner* — Tram H Nguyen
(74) *Attorney, Agent, or Firm* — Fujitsu Patent Center

(57) ABSTRACT

A disclosed compound semiconductor device includes a substrate, a channel layer formed over the substrate, an electron supply layer famed on the channel layer, a first cap layer and a second cap layer formed at a distance from each other on the electron supply layer, a source electrode formed on the first cap layer, a drain electrode formed on the second cap layer, and a gate electrode formed on the electron supply layer between the first cap layer and the second cap layer. Each of the first cap layer and the second cap layer is a stacked film formed by alternately stacking i-type first compound semiconductor layers and n-type second compound semiconductor layers having a wider bandgap than the first compound semiconductor layers.

9 Claims, 24 Drawing Sheets

(51) Int. Cl.
*H01L 29/10* (2006.01)
*H01L 29/205* (2006.01)
*H01L 29/08* (2006.01)
*H01L 29/15* (2006.01)
*H01L 21/02* (2006.01)
*H01L 29/207* (2006.01)
*H01L 29/20* (2006.01)

(52) U.S. Cl.
CPC .......... *H01L 29/155* (2013.01); *H01L 29/205* (2013.01); *H01L 29/66462* (2013.01); *H01L 29/7784* (2013.01); *H01L 21/0262* (2013.01); *H01L 21/02392* (2013.01); *H01L 21/02463* (2013.01); *H01L 21/02546* (2013.01); *H01L 21/02576* (2013.01); *H01L 29/2003* (2013.01); *H01L 29/207* (2013.01); *H01L 29/7787* (2013.01)

(58) Field of Classification Search
USPC ..... 257/E27.017, E27.03–E27.032, E27.109, 257/E29.194–E29.225, E21.382–E21.385, 257/E21.695–E21.696, 163–166, 205, 257/273, 351, 361, 378, 423, 427, 474, 257/477, 517, 526, 539, 544, 565–593, 257/E51.004, E27.019–E27.023, 257/E27.037–E27.043, E27.053–E27.058, 257/E27.074, E27.075–E27.078, E27.106, 257/E27.149, E29.03–E29.035, 257/E29.044–E29.045, E29.114, E29.124, 257/E29.027, E29.028, E29.066–E29.067, 257/E21.608–E21.613, E21.372, 257/E21.38–E21.381, E21.369–21.393; 438/202–208, 234–239, 170, 189, 438/309–378

See application file for complete search history.

(56) References Cited

U.S. PATENT DOCUMENTS

| 2005/0082568 | A1 | 4/2005 | Hirose et al. |
| 2008/0023726 | A1* | 1/2008 | Adesida .............. H01L 21/8252 257/194 |
| 2013/0161709 | A1* | 6/2013 | Endoh .................. H01L 29/365 257/288 |
| 2015/0236109 | A1* | 8/2015 | Chang ............... H01L 29/66431 257/194 |
| 2015/0357420 | A1* | 12/2015 | Endoh ................ H01L 29/7784 257/76 |

FOREIGN PATENT DOCUMENTS

| JP | S63-001064 | 1/1988 |
| JP | 2008-098674 | 4/2008 |

OTHER PUBLICATIONS

Akazaki et al., "Kink Effect in an InAs-Inserted-Channel InAlAs/InGaAs Inverted HEMT at Low Temperature", IEEE Electron Device Letters., vol. 17, No. 7, pp. 378-380 (3 pages), Jul. 1996.

Oliver et al., "Electrical Characterization and Alloy Scattering Measurements of LPE GaxIn1—xAs/InP for High Frequency Device Applications", Journal of Crystal Growth 54, pp. 64-68 (5 pages), 1981.

EESR—The extended European Search Report dated Feb. 7, 2018 for European Patent Application No. 17180777.9.

* cited by examiner

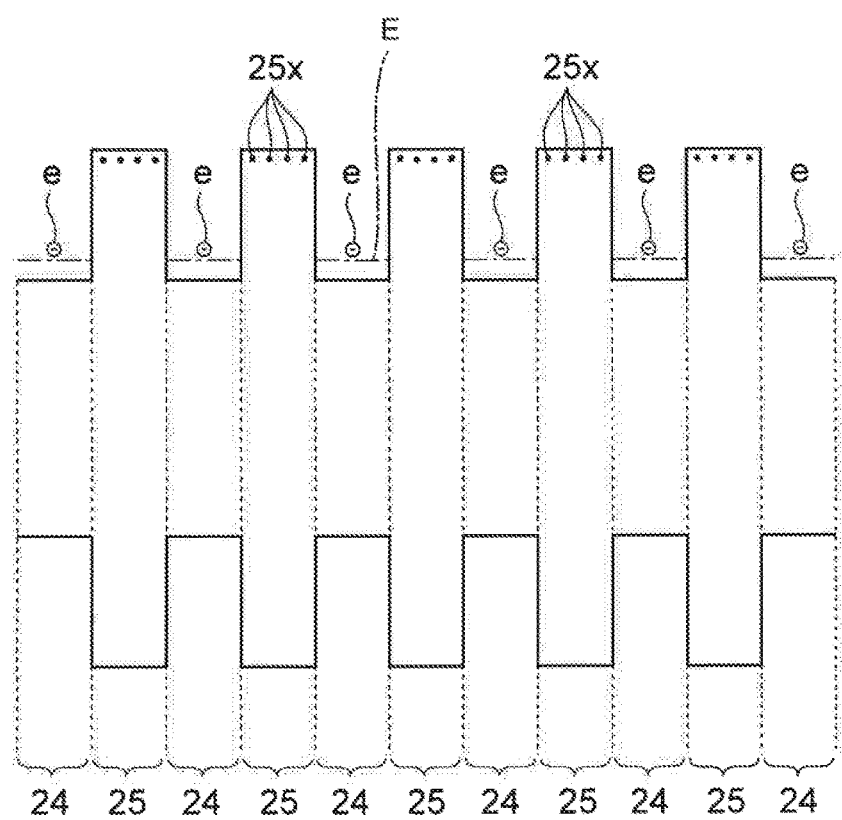

FIG.8

|  | Comparative Example (n-InGaAs) | Present Embodiment (n-InAlAs/i-InGaAs Superlattice) |
|---|---|---|
| Mobility at 300K (cm$^2$/Vs) | 2,000 | 10,000 |
| Mobility at 4K (cm$^2$/Vs) | 2,500 | 60,000 |
| Sheet Resistance at 300K (Ω/square) | 62.4 | 62.4 |
| Sheet Resistance at 4K (Ω/square) | 49.9 | 10.4 |
| Ratio of Sheet Resistance (%) | 80% | 17% |

FIG.13

| First and Second Contact Layers 26a and 26b ||
|---|---|
| First Compound Semiconductor Layer 24 | Second Compound Semiconductor Layer 25 |
| i-InAs | n-InAlAs or n-InGaAs |

FIG. 14

| | Substrate 20 | Channel Layer 22 | Electron Supply Layer 23 | First and Second Contact Layers 26a and 26b | |
|---|---|---|---|---|---|
| | | | | First Compound Semiconductor Layer 24 | Second Compound Semiconductor Layer 25 |
| GaN HEMT | GaN | GaN | n-AlGaN | i-InGaN | n-GaN or n-AlGaN |

FIG. 15

| | Substrate 20 | Channel Layer 22 | Electron Supply Layer 23 | First and Second Contact Layers 26a and 26b | |
|---|---|---|---|---|---|
| | | | | First Compound Semiconductor Layer 24 | Second Compound Semiconductor Layer 25 |
| GaAs HEMT | GaAs | GaAs | n-AlGaAs | i-GaAs or i-InGaAs | n-AlGaAs |

COMPOUND SEMICONDUCTOR DEVICE AND METHOD OF MANUFACTURING THE COMPOUND SEMICONDUCTOR DEVICE

CROSS-REFERENCE TO RELATED APPLICATION(S)

This application is based upon and claims the benefit of priority of the prior Japanese Patent Application No. 2016-164679, filed on Aug. 25, 2016, the entire contents of which are incorporated herein by reference.

FIELD

The present invention relates to a compound semiconductor device and a method of manufacturing a compound semiconductor device.

BACKGROUND

Compound semiconductor devices are divided into various types. Among them, a high electron mobility transistor (HEMT) has advantages of low noise and high-speed operation, and is used in microwave and millimeter-wave amplifiers for these advantages.

Since the channel layer of an HEMT is not doped with impurities, no impurity scattering occurs in the channel layer, whereby the mobility of two-dimensional electron gas in the channel layer increases.

There are a variety of combinations of the materials for the channel layer and a compound semiconductor substrate.

For example, there is a GaAs HEMT in which an i-type $In_xGa_{1-x}As$ (x=0.1 to 0.2) layer is formed as a channel layer on a GaAs substrate. Such a GaAs HEMT is called a pseudomorphic HEMT (p-HEMT), because the GaAs substrate and the channel layer are pseudo-lattice-matched. In the p-HEMT, In in $In_xGa_{1-x}As$ of the channel layer contributes to further increase in the mobility of two-dimensional electron gas.

There is also an InP HEMT, in which an InP substrate is used as a compound semiconductor substrate. The channel layer of an InP HEMT is, for example, an i-type $In_{0.53}Ga_{0.47}As$ layer which is lattice-matched with the InP substrate. For the purpose of increasing the mobility of electrons, an i-type $In_xGa_{1-x}As$ (0.53<x) layer with a higher content ratio of In than the $In_{0.53}Ga_{0.47}As$ layer is used as the channel layer of the InP HEMT in some cases.

It was reported that, when an InGaAs layer is reduced in temperature, two-dimensional electron gas is less likely to suffer phonon scattering and therefore increases in mobility. For instance, it was reported that the mobility of two-dimensional electron gas in an $In_{0.53}Ga_{0.47}As$ layer, which is 10,000 $cm^2/Vs$ at room temperature (300K), improves to 60,000 $cm^2/Vs$ at extremely low temperature (4K).

Since mobility in the channel layer of the HEMT thus improves at low temperature, it is contemplated that the HEMT can be used to achieve an amplifier producing low noise at low temperature.

Noted that the related techniques are disclosed in the following literature.

Japanese Laid-open Patent Publication No. 2008-98674;
Japanese Examined Laid-open Patent Publication No. Hei 5-4812;
Matsuoka et al., "Temperature Dependence of Electron Mobility in InGaAs/InAlAs Heterostructures", Japanese Journal of Applied Physics. vol. 29, no. 10, pp. 2017-2025, 1990;
Akazaki et al., "Kink Effect in an InAs-Inserted-Channel InAlAs/InGaAs Inverted HEMT at Low Temperature", IEEE Electron Device Letters., vol. 17, no. 7, pp. 378-380, 1996; and
Oliver et al., "ELECTRICAL CHARACTERIZATION AND ALLOY SCATTERING MEASUREMENTS OF LPE GaxIn1-xAs/InP FOR HIGH FREQUENCY DEVICE APPLICATIONS", Journal of Crystal Growth 54, pp. 64-68, 1981.

SUMMARY

According to an aspect discussed herein, there is provided a compound semiconductor device including a substrate, a channel layer formed over the substrate, an electron supply layer famed on the channel layer, a first cap layer and a second cap layer formed at a distance from each other on the electron supply layer, a source electrode formed on the first cap layer, a drain electrode formed on the second cap layer, and a gate electrode formed on the electron supply layer between the first cap layer and the second cap layer, wherein each of the first cap layer and the second cap layer is a stacked film famed by alternately stacking i-type first compound semiconductor layers and n-type second compound semiconductor layers having a wider bandgap than the first compound semiconductor layers.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 6 is a diagram illustrating the energy band structure of a first cap layer according to the first embodiment;

FIG. 8 is a diagram illustrating calculated resistances of the first cap layer according to the first embodiment;

FIG. 13 is a diagram illustrating another example of materials for the respective layers of an InP HEMT manufactured as a compound semiconductor device;

FIG. 14 is a diagram illustrating an example of materials for the respective layers of a GaN HEMT manufactured as a compound semiconductor device; and FIG. 15 is a diagram illustrating an example of materials for the respective layers of a GaAs HEMT manufactured as a compound semiconductor device.

DESCRIPTION OF EMBODIMENTS

Prior to describing embodiments, a description is given of matters studied by the inventor of the present application.

Figure 1:
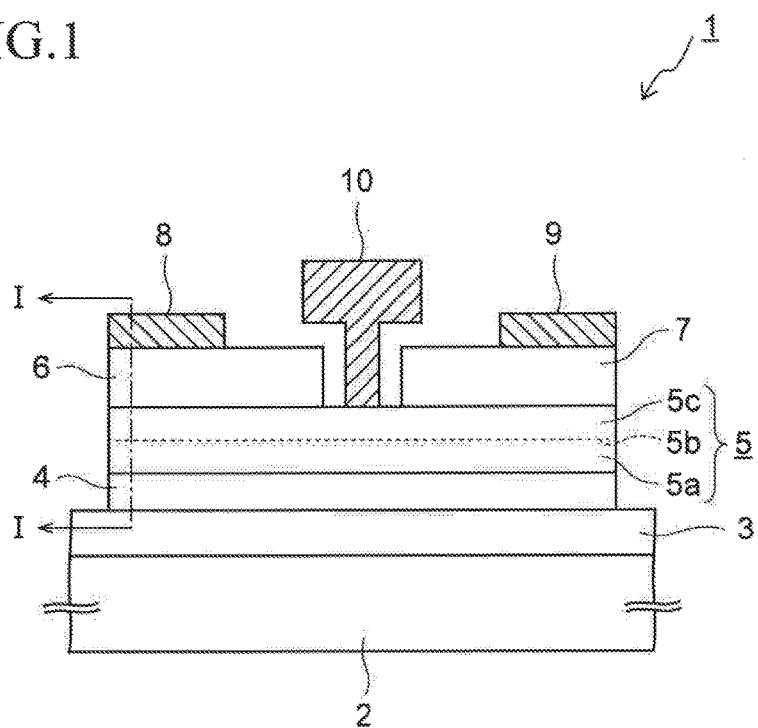
FIG. 1 is a sectional view of a compound semiconductor device used for study.

FIG. 1 is a sectional view of a compound semiconductor device used in this study.

This compound semiconductor device 1 is an InP HEMT, and has a buffer layer 3, a channel layer 4, and an electron supply layer 5 formed in this order on an InP substrate 2.

Among these layers, the buffer layer 3 plays a role of preventing a defect in the InP substrate 2 from affecting the channel layer 4, and is an i-type InAlAs layer in this example.

The channel layer 4 is a layer in which electrons travel, and is an i-type InGaAs layer for example. Since the channel layer 4 is not doped with impurities, mobility of electrons travelling in the channel layer 4 is prevented from being decreased due to impurity scattering.

The electron supply layer 5 is a compound semiconductor layer that supplies electrons to the channel layer 4. In this example, the electron supply layer 5 is formed by stacking a spacer layer 5a and a barrier layer 5c in this order, with a doped layer 5b of silicon as n-type impurity famed in their interface. The spacer layer 5a and the barrier layer 5c are both made of i-type InAlAs.

According to this structure, two-dimensional electron gas is induced in the channel layer 4 due to the n-type impurities in the doped layer 5b.

In addition, since the spacer layer 5a prevents the n-type impurities in the doped layer 5b from diffusing into the channel layer 4, impurity scattering due to the n-type impurities does not occur in the channel layer 4, allowing the mobility of the electrons in the channel layer 4 to be maintained at a high value.

Moreover, the barrier layer 5c and a gate electrode to be described later form a Schottky barrier therebetween, by which the transistor's amplification operation is achieved.

The electron supply layer 5 may be formed by, after stopping growing the spacer layer 5a, exposing the surface of the spacer layer 5a to a gas containing n-type impurities such as silicon to form the doped layer 5b, and then growing the barrier layer 5c. Such a method of forming the doped layer 5b is also called planar doping.

On the electron supply layer 5, a first cap layer 6 and a second cap layer 7 are famed at a distance from each other. Moreover, a source electrode 8 is famed on the first cap layer 6, and a drain electrode 9 is formed on the second cap layer 7.

The first cap layer 6 is an n-type compound semiconductor layer provided to reduce the resistance between the electron supply layer 5 and the source electrode 8. The higher the concentration of the n-type impurities in the first cap layer 6, the more the resistance between the electron supply layer 5 and the source electrode 8 is reduced. In this example, the first cap layer 6 is an InGaAs layer heavily doped with silicon as n-type impurities with a concentration of approximately $1 \times 10^{19}$ cm$^{-3}$.

Note that the second cap layer 7 is famed in the same step as the first cap layer 6, and is, like the first cap layer 6, an InGaAs layer heavily doped with silicon.

Then, a gate electrode 10 is formed on the electron supply layer 5 in the area between the cap layers 6 and 7.

Figure 2:
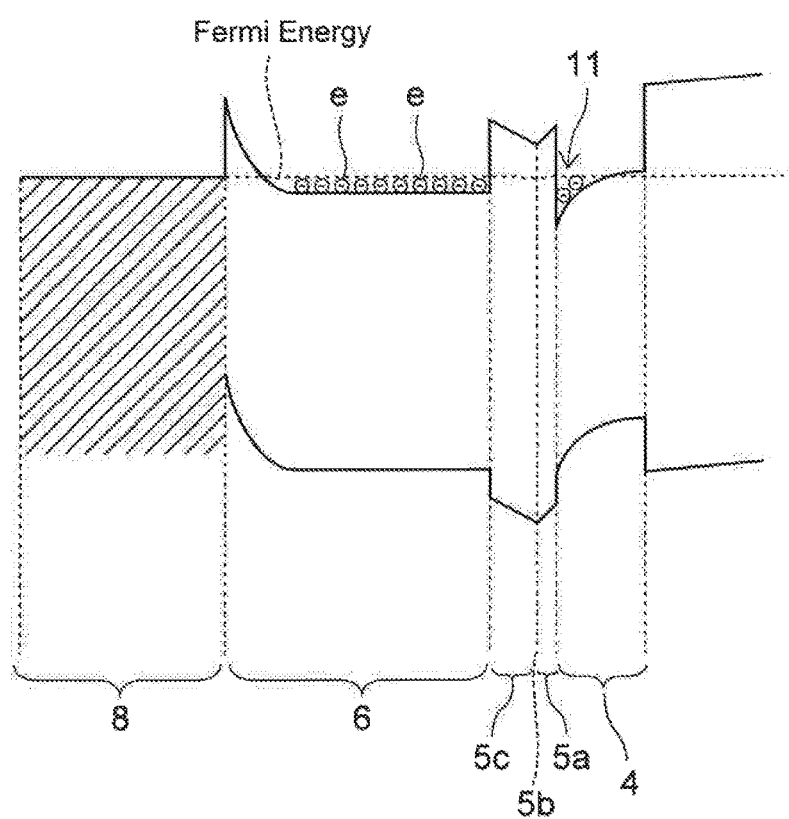
FIG. 2 is a diagram illustrating the energy band structure of the compound semiconductor device in FIG. 1.

FIG. 2 is a diagram illustrating the energy band structure of the compound semiconductor device 1.

As illustrated in FIG. 2, since the first cap layer is heavily doped with silicon as n-type impurities, carrier concentration of the first cap layer 6 becomes high. Therefore, a large quantity of electrons e can be generated in the first cap layer 6.

In addition, the n-type impurities in the doped layer 5b cause two-dimensional electron gas 11 to be induced in the channel layer 4.

According to the compound semiconductor device 1, since impurities are not doped in the channel layer 4 as described above, the mobility of the electrons in the channel layer 4 is expected to not decrease due to the impurity scattering. Thus, the noise of drain current is also expected to be reduced.

However, Akazaki et al. cited above reported that the source resistance in the HEMT increases at low temperature. According to this report, the source resistance decreases from 1.02 Ωmm to 0.68 Ωmm when the temperature decreases from 300 K to 77 K, but then increases from 0.68 Ωmm to 0.82 Ωmm when the temperature further decreases from 77 K to 4.2 K.

The reason for this is considered as follows.

Figure 3:
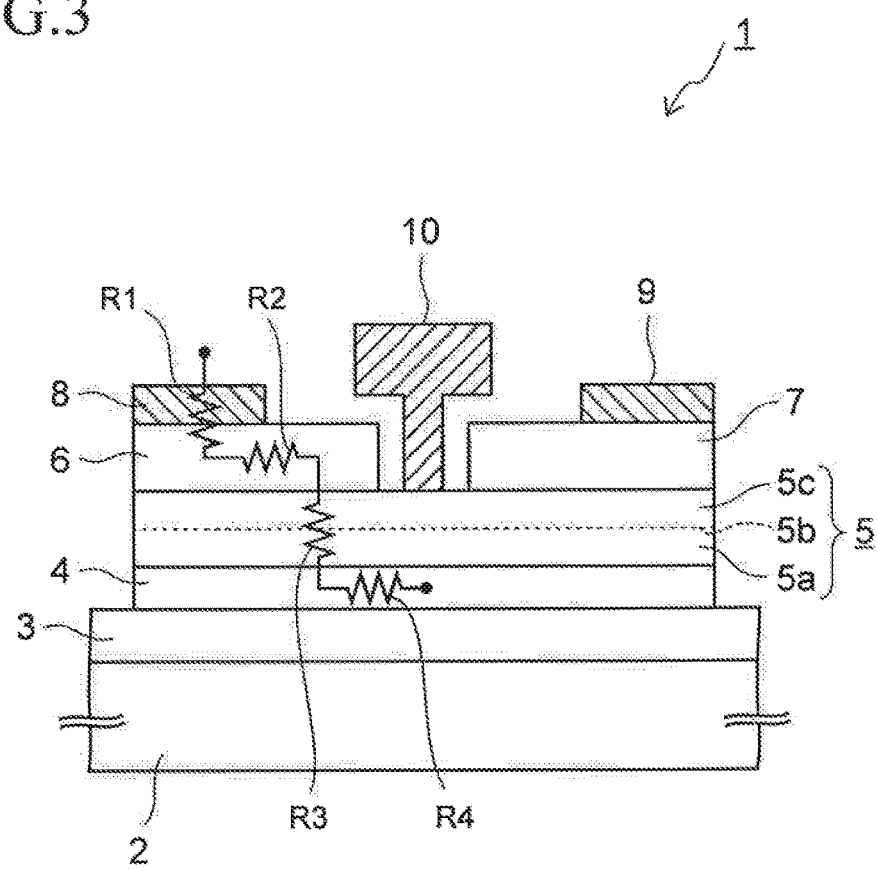
FIG. 3 is a sectional view schematically illustrating the resistances generated in the compound semiconductor device in FIG. 1.

FIG. 3 is a sectional view schematically illustrating the resistances generated in the compound semiconductor device 1.

As depicted in FIG. 3, the compound semiconductor device 1 has a first resistance R1 to a fourth resistances R4, and the source resistance can approximate to the one obtained by connecting the first to fourth resistances R1 to R4 in series.

The first resistance R1 is a contact resistance between the first cap layer 6 and the source electrode 8. The second resistance R2 is the resistance of the first cap layer 6 in the substrate's lateral direction.

The third resistance R3 is the resistance that electrons experience when overriding a barrier famed by the electron supply layer 5. The fourth resistance R4 is the resistance of the channel layer 4 in the substrate's lateral direction.

The inventor of the present application considers that the source resistance increases at extremely low temperature because the second resistance R2, out of the first to fourth resistances R1 to R4, increases at extremely low temperature.

Figure 4:
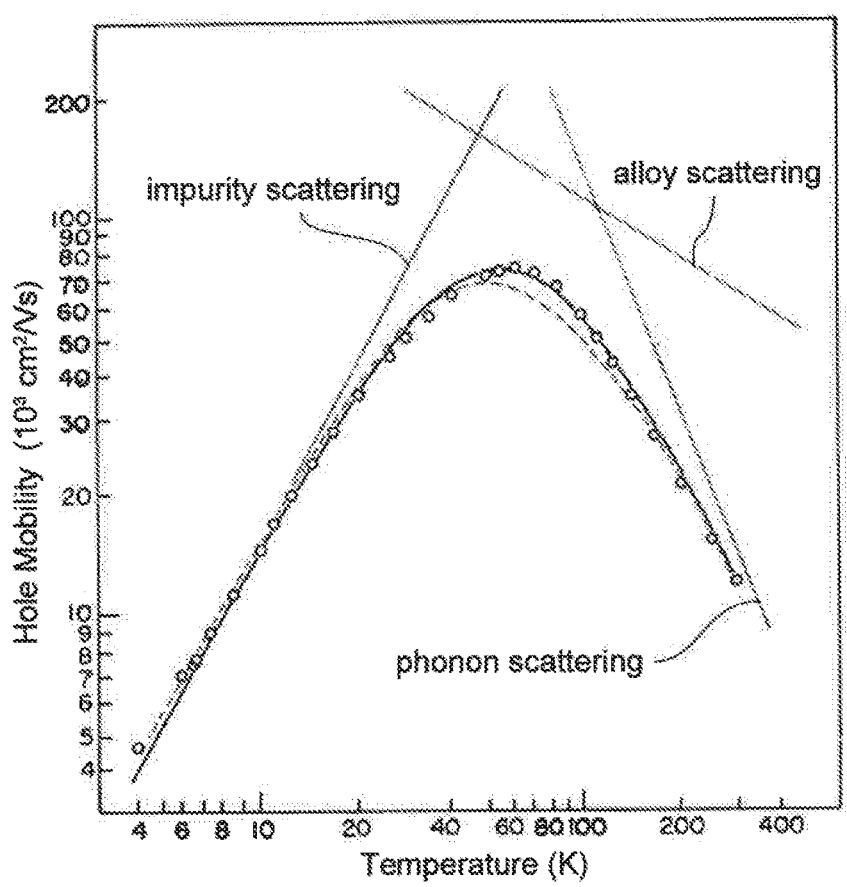
FIG. 4 is a graph illustrating the temperature dependency of the mobility of holes in InGaAs.

FIG. 4 illustrates a reason for this, which depicts a graph illustrating the temperature dependency of the mobility of holes in InGaAs.

As illustrated in FIG. 4, factors for causing the mobility decrease include phonon scattering, alloy scattering, and impurity scattering. Among these factors, phonon scattering and alloy scattering decrease as temperature decreases, whereas impurity scattering is prominent at extremely low temperatures.

Accordingly, as the temperature of InGaAs is reduced, the increase in mobility is saturated at temperatures around 77K and the mobility then decreases at temperatures below this.

In view of this, it can be presumed that the cause for the decrease in the mobility at extremely low temperature is the impurities contained in the compound semiconductor. Among the first to fourth resistances R1 to R4, a resistance generated in an impurity-doped compound semiconductor layer is the second resistance R2, which is generated in the first cap layer 6 doped with n-type impurities.

Therefore, it is considered that the increase in the source resistance at low temperature reported in Akazaki et al. is caused by an increase in the second resistance R2 at low temperature.

Especially, the first cap layer 6 is heavily doped with n-type impurities with a concentration of approximately $1 \times 10^{19}$ cm$^{-3}$ to reduce resistance as described earlier. Therefore, impurity scattering prominently occurs in the first cap layer 6 at extremely low temperature, which presumably increases the second resistance R2 at low temperature.

In view of these findings, in the present embodiment, the resistance of a cap layer is decreased so that the source resistance of an HEMT at low temperatures may be maintained to be low as follows.

First Embodiment

A compound semiconductor device according to the present embodiment is described while following its manufacturing process.

FIGS. 5A to 5M are sectional views of the compound semiconductor device in the course of manufacturing thereof according to the present embodiment.

In the present embodiment, an InP HEMI is manufactured as a compound semiconductor device as follows.

Figure 5A:
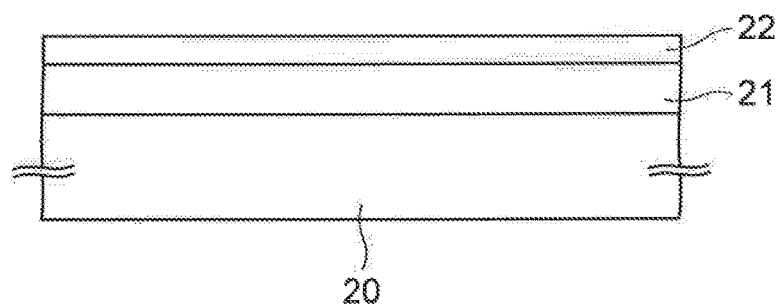
FIGS. 5A to 5M are sectional views of a compound semiconductor device in the course of manufacturing thereof according to a first embodiment.

First, as illustrated in FIG. 5A, a compound semiconductor substrate such as an InP substrate is prepared as a substrate 20.

Then, while placing the substrate 20 in an unillustrated chamber, an i-type InAlAs layer is famed as a buffer layer 21 to a thickness of about 300 nm on the substrate 20 by metal organic chemical vapor deposition (MOCVD) method.

Growth gas used for the formation of the InAlAs layer is not particularly limited. For example, a material gas for In is trimethylindium ($(CH_3)_3In$) or triethylindium ($(C_2H_5)_3In$). A material gas for Al is trimethylaluminum ($(CH_3)_3Al$) or triethylaluminum ($(C_2H_5)_3Al$). A material gas for As is arsine ($AsH_3$).

Moreover, the composition ratio of the InAlAs layer is not particularly limited. In the present embodiment, an $In_{0.52}Al_{0.48}As$ layer that lattice-matches with the InP substrate used as the substrate 20 is famed as the buffer layer 21.

Such a composition ratio and material gas for the InAlAs layer described above also apply to other InAlAs layers to be formed in the subsequent steps.

Then, while keeping the substrate 20 still in the chamber, an i-type InGaAs layer is famed on the buffer layer 21 to a thickness of about 15 nm by MOCVD method, and the InGaAs layer is used as a channel layer 22.

Growth gas for this InGaAs layer is not particularly limited, ether. A material gas for In is trimethylindium or triethylindium, a material gas for Ga is trimethylgallium ($(CH_3)_3Ga$) or triethylgallium ($(C_2H_5)_3Ga$). Also, a material gas for As is arsine.

Also, the composition ratio of the InGaAs layer is $In_{0.53}Ga_{0.48}As$ that lattice-matches with InP which is the material for the substrate 20.

Such a composition ratio and material gas for the InGaAs layer described above also apply to other InGaAs layers to be formed in the subsequent steps.

Figure 5B:
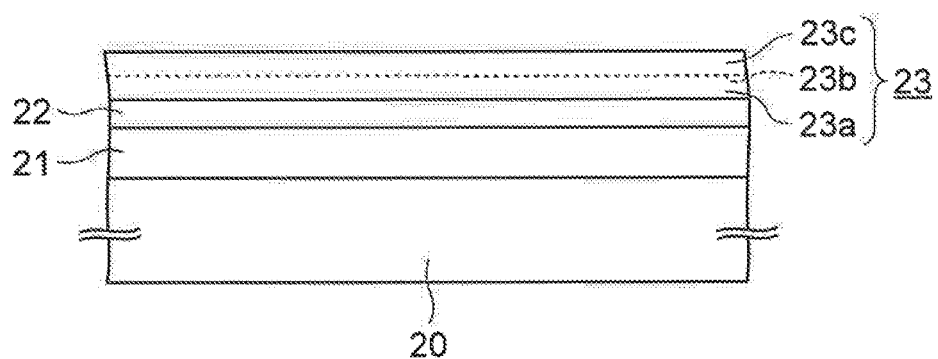

Next, a description is given of the step illustrated in FIG. 5B.

First, while using the chamber used in the above, an i-type InAlAs layer is formed to a thickness of about 3 nm on the channel layer 22 by MOCVD method with the chamber being supplied with the same growth gas as used for the buffer layer 21. This i-type InAlAs layer is used as a spacer layer 23a.

Then, the supply of the growth gas is temporally stopped, and the chamber is supplied with silane ($SiH_4$) or disilane ($Si_2H_6$), which is a material gas for silicon. As a result, an n-type doped layer 23b is formed in the surface of the spacer layer 23a by planar doping. The doped layer 23b is doped with silicon as n-type impurities with a concentration of approximately $5 \times 10^{12}$ cm$^{-2}$.

Thereafter, while supplying the growth gas for an InAlAs layer to the above chamber again, an i-type InAlAs layer is formed as a barrier layer 23c to a thickness of about 10 nm on the doped layer 23b by MOCVD method.

With the above steps, an electron supply layer 23 is formed by stacking the spacer layer 23a, the n-type doped layer 23b, and the barrier layer 23c in this order.

According to the electron supply layer 23 with such a layered structure, like that in the example illustrated in FIG. 1, the spacer layer 23a can prevent the n-type impurities in the doped layer 23b from diffusing into the channel layer 22, and a Schottky barrier can be famed between the barrier layer 23c and a gate electrode to be described later.

Note that when these advantages are not necessary, a single layered n-type InAlAs layer may be famed as the electron supply layer 23.

Figure 5C:
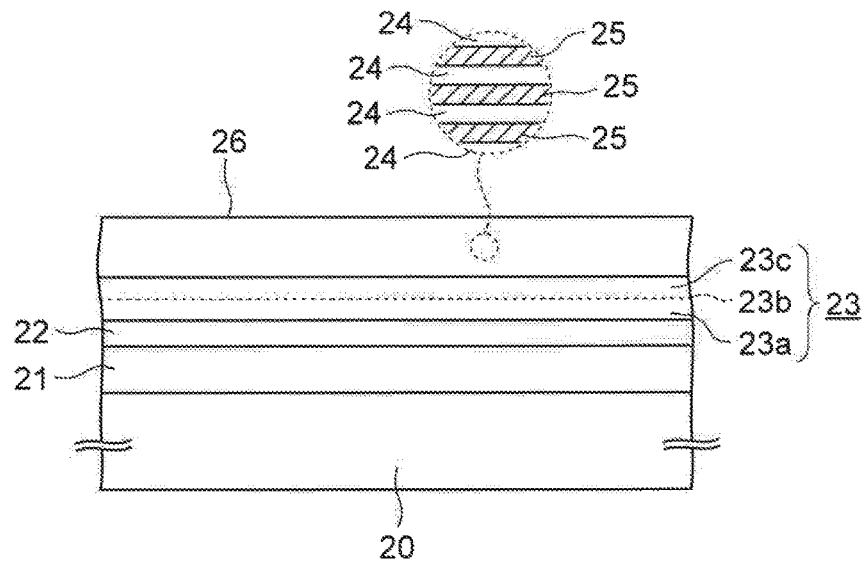

Next, as illustrated in FIG. 5C, i-type first compound semiconductor layers 24 and n-type second compound semiconductor layers 25 are alternately stacked in this order on the electron supply layer 23 by MOCVD method in the above chamber to form a stacked film 26 of the first compound semiconductor layers 24 and the second compound semiconductor layers 25.

In the present embodiment, materials for the first compound semiconductor layers 24 and the second compound semiconductor layers 25 are selected so that the second compound semiconductor layers 25 have a wider bandgap than those of the first compound semiconductor layers 24.

There exist several combinations of materials to achieve this. In the following example, the first compound semiconductor layers 24 are InGaAs layers, and the second compound semiconductor layers 25 are InAlAs layers that are uniformly doped with silicon as n-type impurities with a concentration of about $1 \times 10^{19}$ cm$^{-2}$.

To dope an InAlAs layer with silicon, a silane-based gas, such as silane or disilane, may be added to the aforementioned growth gas for InAlAs. To control the doping amount of silicon in the InAlAs layer, the flow rate of the silane-based gas may be adjusted.

The bandgaps of the compound semiconductor layers 24 and 25 depend on their composition ratios. In the case where an i-type $In_{0.53}Ga_{0.48}As$ layer is famed as the first compound semiconductor layer 24, the bandgap of the $In_{0.53}Ga_{0.48}As$ layer is 0.74 eV. In the case where an n-type $In_{0.52}Al_{0.48}As$ layer is famed as the second compound semiconductor layer 25, the bandgap of the $In_{0.52}Al_{0.48}As$ layer is 1.46 eV.

The film thicknesses of the compound semiconductor layers 24 and 25 are not particularly limited, either. In the present embodiment, the compound semiconductor layers 24 and 25 are each approximately 5 nm thick. A structure in which the compound semiconductor layers 24 and 25 as thin as approximately 5 nm are stacked in this manner is also called a superlattice structure.

The number of the compound semiconductor layers 24 and the number of the compound semiconductor layers 25 are not particularly limited, either. In this example, the stacked film 26 includes six first compound semiconductor layers 24 and five second compound semiconductor layers 25. Then, the first compound semiconductor layers 24 are disposed at the uppermost layer and the lowermost layer of the stacked film 26.

Although the $In_{0.53}Ga_{0.48}As$. layer of the first compound semiconductor layer 24 and the $In_{0.52}Al_{0.48}As$ layer of the second compound semiconductor layer 25 are lattice-matched with each other, the lattice matching may be not needed when the first compound semiconductor layer 24 and the second compound semiconductor layer 25 have different bandgap.

Figure 5D:
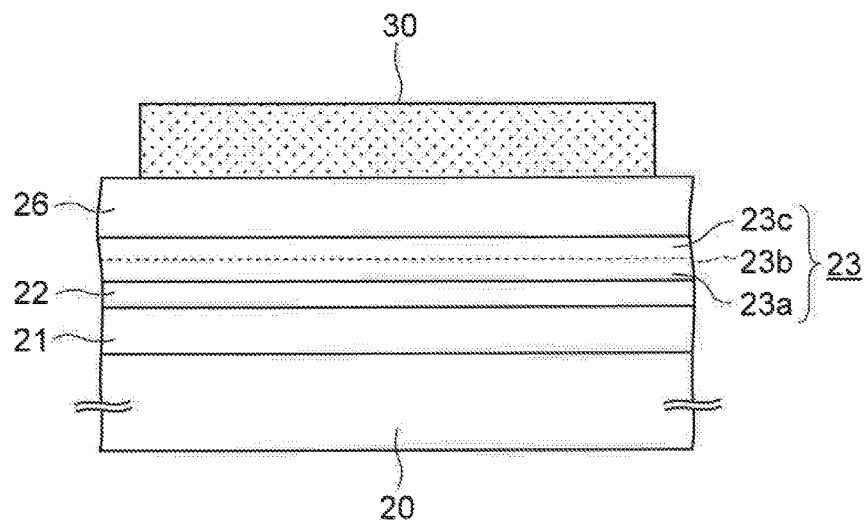

Next, as illustrated in FIG. 5D, a photoresist is applied to the stacked film 26 to form a first resist layer 30 by exposing and developing the photoresist.

Figure 5E:
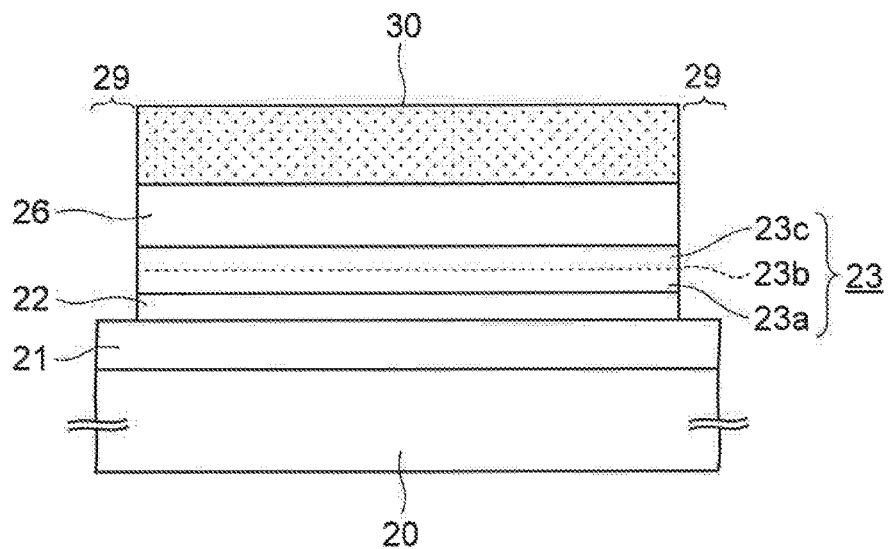

Then, as illustrated in FIG. 5E, while using the first resist layer 30 as a mask, the channel layer 22, the electron supply layer 23, and the stacked film 26 are wet-etched to form a device isolation trench 29 in these layers.

Etching liquid used for this wet etching is not particularly limited. For example, a mixed solution of phosphoric acid and hydrogen peroxide solution may be used as the etching liquid.

Thereafter, the first resist layer 30 is removed.

Figure 5F:
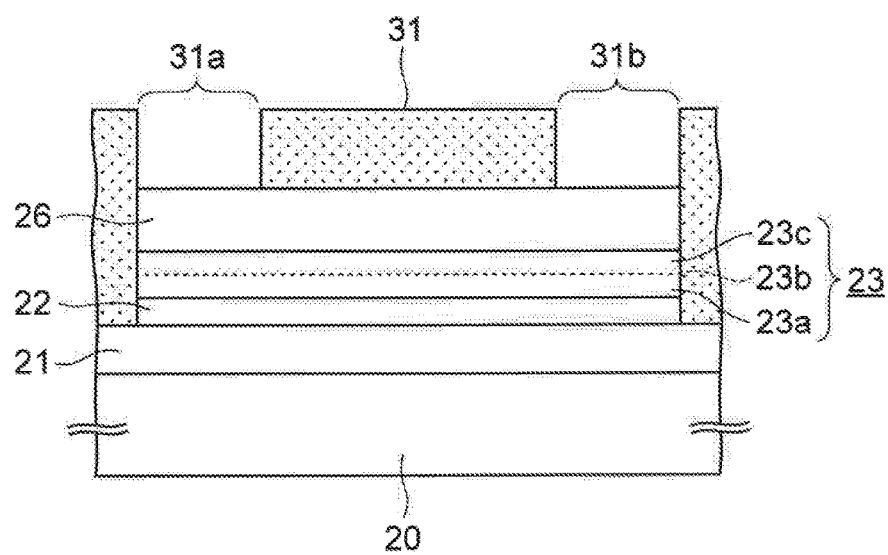

Subsequently, as illustrated in FIG. 5F, a photoresist is applied to the entire upper surface of the substrate 20. Then, the photoresist is exposed and developed, thereby forming a second resist layer 31 including a first opening 31a and a second opening 31b.

Figure 5G:
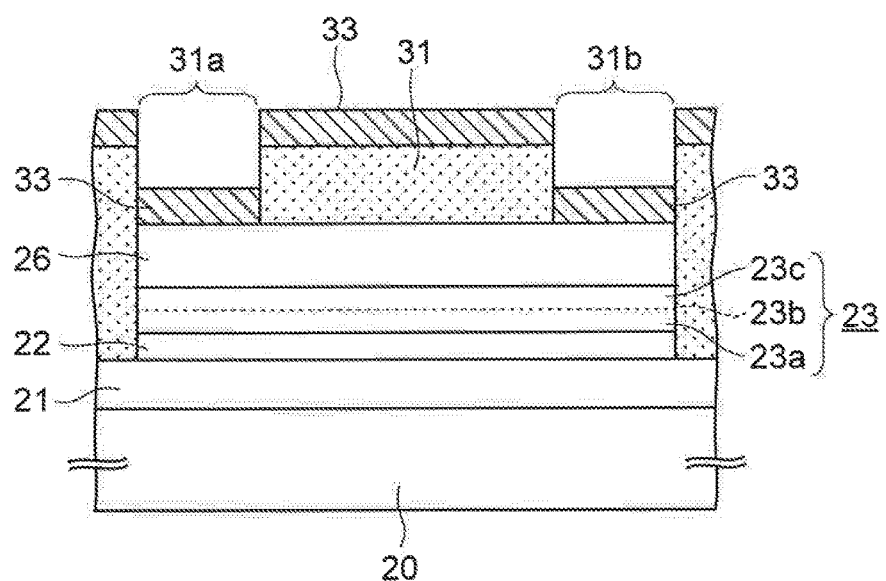

Next, as illustrated in FIG. 5G, a metal stacked film 33 is famed on the second resist layer 31 and in the openings 31a and 31b by vapor deposition. The metal stacked film 33 is famed by stacking, for example, a titanium layer of about 10 nm thickness, platinum layer of about 30 nm thickness, and a gold layer of about 300 nm thickness in this order.

Figure 5H:
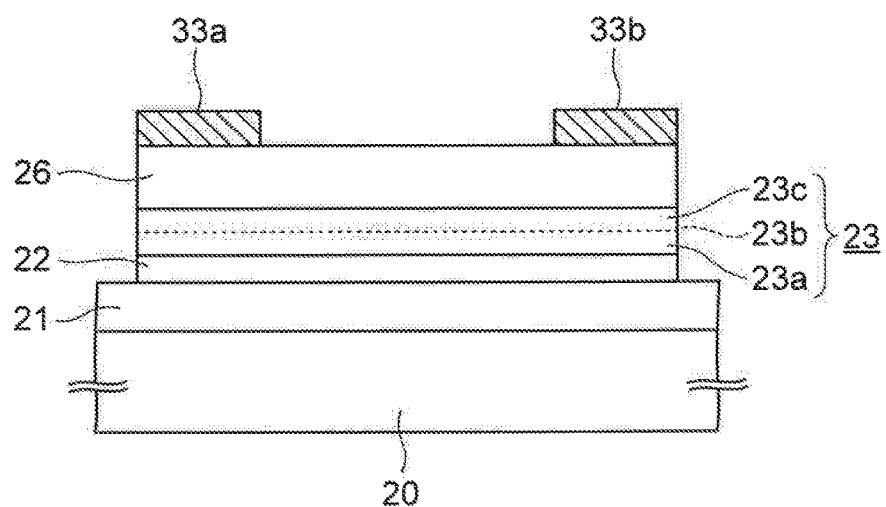

Next, as illustrated in FIG. 5H, the second resist layer 31 is removed with an organic solution, so that the metal stacked film 33 formed in the first opening 31a and the second opening 31b are left on the stacked film 26 as a source electrode 33a and a drain electrode 33b, respectively. Such a method of patterning the metal stacked film 33 is called liftoff process.

Figure 5I:
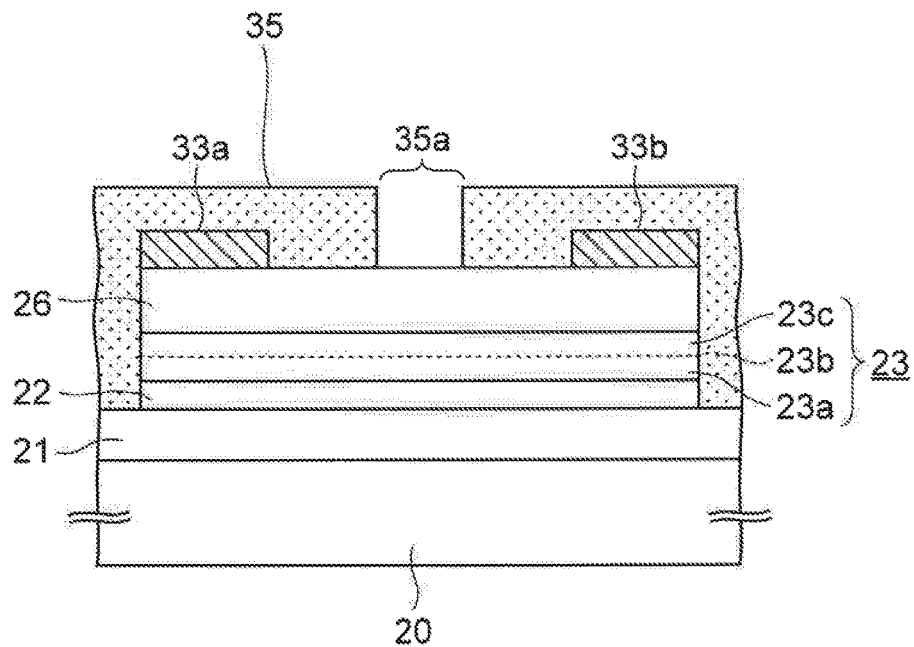

Then, as illustrated in FIG. 5I, an electron beam resist is applied to the entire upper surface of the substrate 20. The resist is exposed to an electron beam, and then developed to be formed into a third resist layer 35 including a third opening 35a between the source electrode 33a and the drain electrode 33b.

Figure 5J:
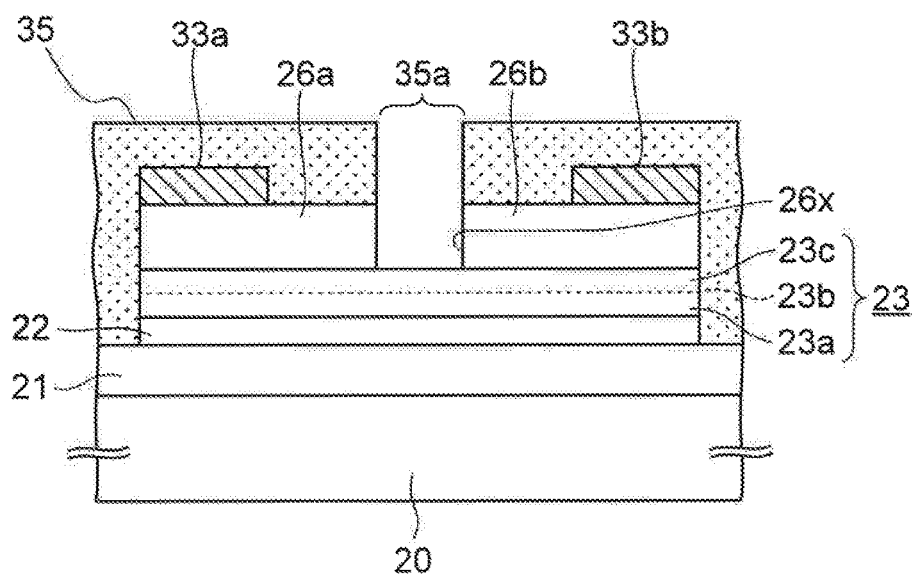

Then, as illustrated in FIG. 5J, the stacked film is wet-etched through the third opening 35a to be patterned, thereby forming a groove 26x in the stacked film 26 under the third opening 35a.

As a result of this patterning, the stacked film 26 under the source electrode 33a is left as a first cap layer 26a, and the stacked film 26 under the drain electrode 33b is left as a second cap layer 26b, with these cap layers 26a and 26b being separated by the groove 26x.

Thereafter, the third resist layer 35 is removed.

Figure 5K:
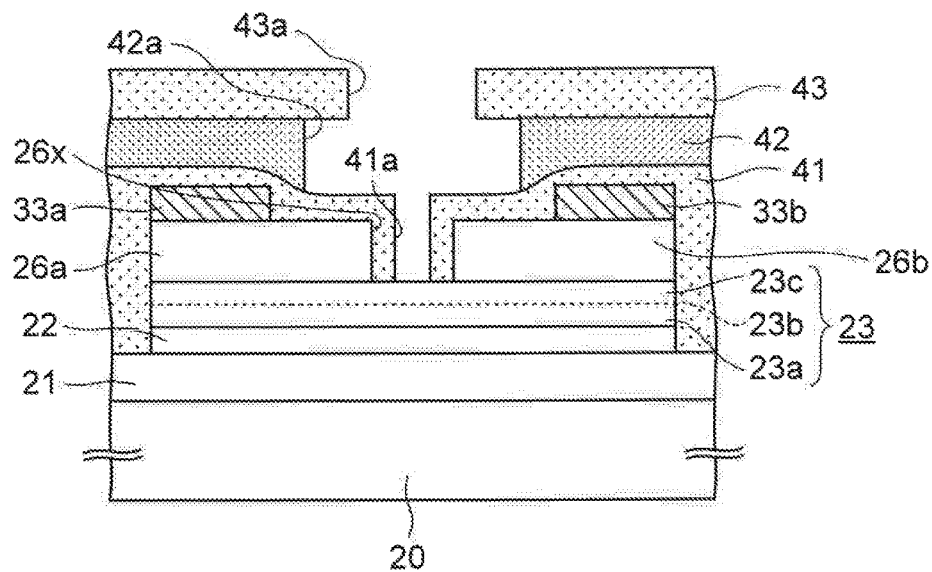

Next, a description is given of the step illustrated in FIG. 5K.

First, fourth to sixth electron-beam resist layers 41 to 43 are formed in this order on the entire upper surface of the substrate 20.

Then, the sixth resist layer 43 is exposed to an electron beam and then developed to form a fourth opening 43a. Furthermore, the fifth resist layer 42 is wet-etched through the fourth opening 43a, thereby forming a fifth opening 42a therein whose side surface is recessed than the fourth opening 43a.

Then, a portion of the fourth resist layer 41 that is exposed through the fifth opening 42a is exposed to an electron beam and then developed, so that a hole 41a is formed in the fourth resist layer 41 in the groove 26x.

Figure 5L:
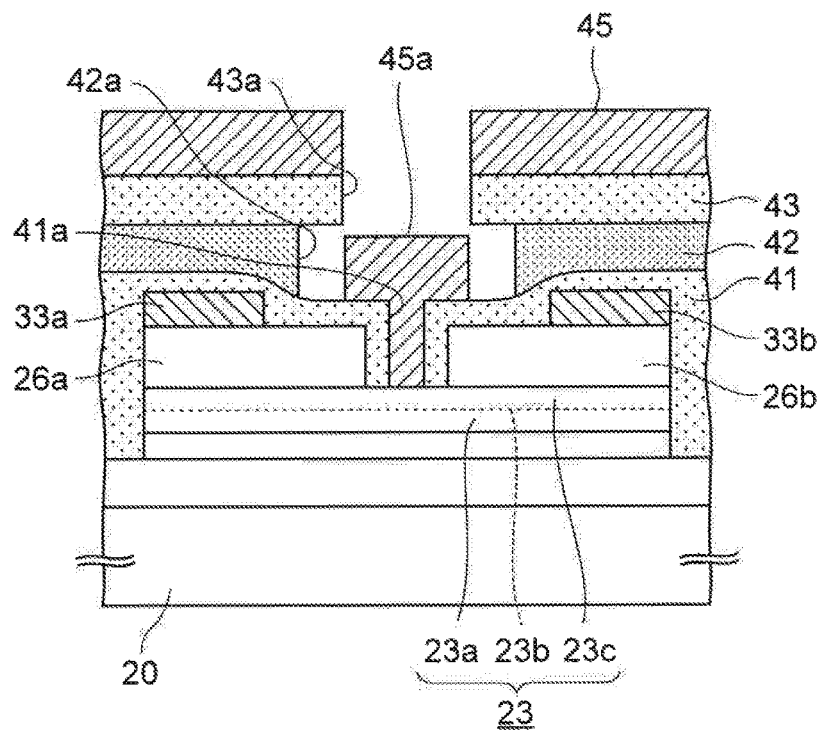

Next, as illustrated in FIG. 5L, a metal stacked film 45 is formed on the sixth resist layer 43 by vapor deposition. The metal stacked film 45 is formed by stacking a titanium layer of about 10 nm thickness, a platinum layer of about 30 nm thickness, and a gold layer of about 300 nm thickness.

The metal laminated film 45 is also formed in the hole 41a and the openings 42a and 43a, whereby a T shaped gate electrode 45a is formed on the electron supply layer 23.

Figure 5M:
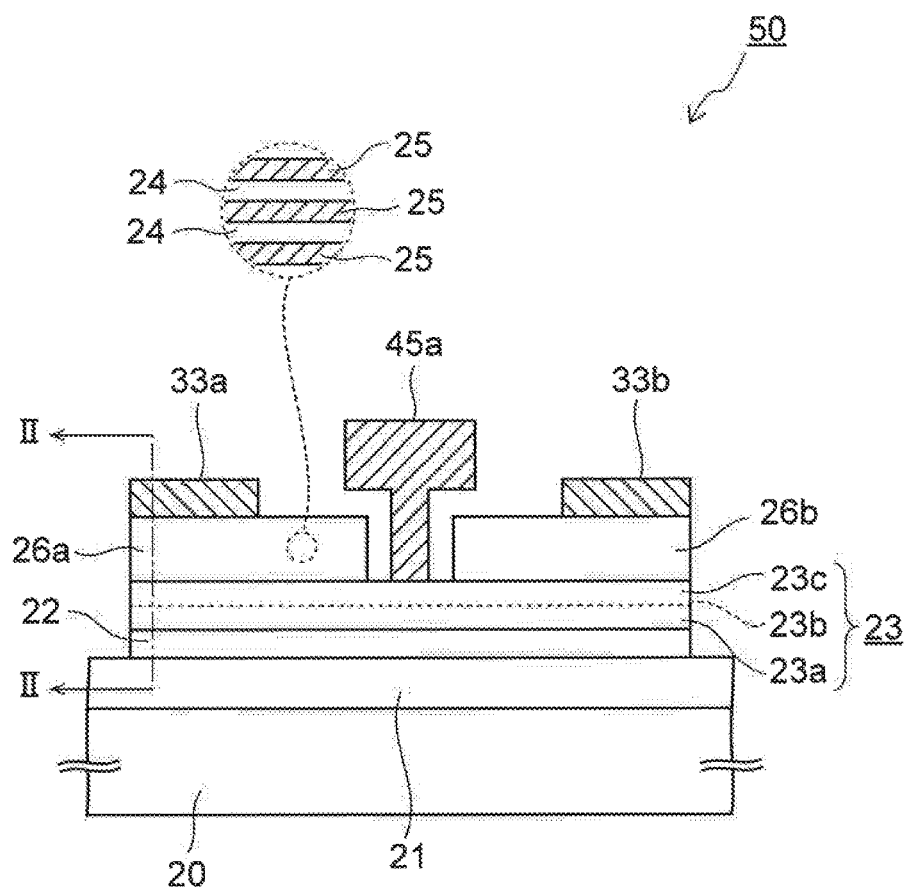

Thereafter, as illustrated in FIG. 5M, the resist layers 41 to 43 are dissolved with an organic solution to be removed.

With this, the basic structure of a compound semiconductor device 50 according to the present embodiment is complete.

In the compound semiconductor device 50, the first compound semiconductor layers 24 and the second compound semiconductor layers 25 having different bandgaps from each other are stacked to form the first cap layer 26a having a superlattice structure.

FIG. 6 is a diagram illustrating the energy band structure of the first cap layer 26a.

As illustrated in FIG. 6, the second compound semiconductor layer 25 is uniformly doped with silicon as n-type impurities 25x, and the n-type impurities 25x cause electrons e to be induced in the first compound semiconductor layer 24.

Moreover, since the compound semiconductor layers 24 and 25 have different bandgaps from each other, a quantum well is formed in the first cap layer 26a.

Most of the electrons e in the first cap layer 26a are trapped in the quantum well, and take discrete energy E in the quantum well. The electrons e travel freely in the first compound semiconductor layers 24 in the substrate's lateral direction by the momentum corresponding to the energy E.

As a result, unlike the example in FIG. 1, most of the electrons travelling in the first cap layer 26a in the substrate's lateral direction are not scattered by the n-type impurities 25x. Therefore, the resistance of the first cap layer 26a can be prevented from increasing at low temperature due to impurity scattering.

Moreover, by providing a plurality of n-type second compound semiconductor layers 25 in this manner, more electrons can be induced in the first compound semiconductor layers 24 than in the case of only one second compound semiconductor layer 25 is provided, thus making it possible to lower the sheet resistance of the first cap layer 26a.

Still further, since film thickness of the second compound semiconductor layer 25 is thin, the electrons e can easily tunnel through the second compound semiconductor layer 25. Thus, the electrons e can also easily flow in the thickness direction of the first cap layer 26a. Moreover, since the tunneling current is not scattered by the n-type impurities 25x, the resistance of the first cap layer 26a in its thickness direction can also be maintained to be low.

In order for the electrons e to be able to easily tunnel through the second compound semiconductor layer 25, it is preferable to thin the second compound semiconductor layer 25 to the thickness of about 5 nm to 10 nm.

Moreover, in order for the electrons e to take the discrete energy E in the quantum well as described above, it is preferable to thin the first compound semiconductor layer 24 to the thickness of about 5 nm to 10 nm.

Furthermore, for the same reason that the resistance of the first cap layer 26a can be reduced, resistance of the second cap layer 26b, which has the same structure as the first cap layer 26a, can also be reduced.

Figure 7:
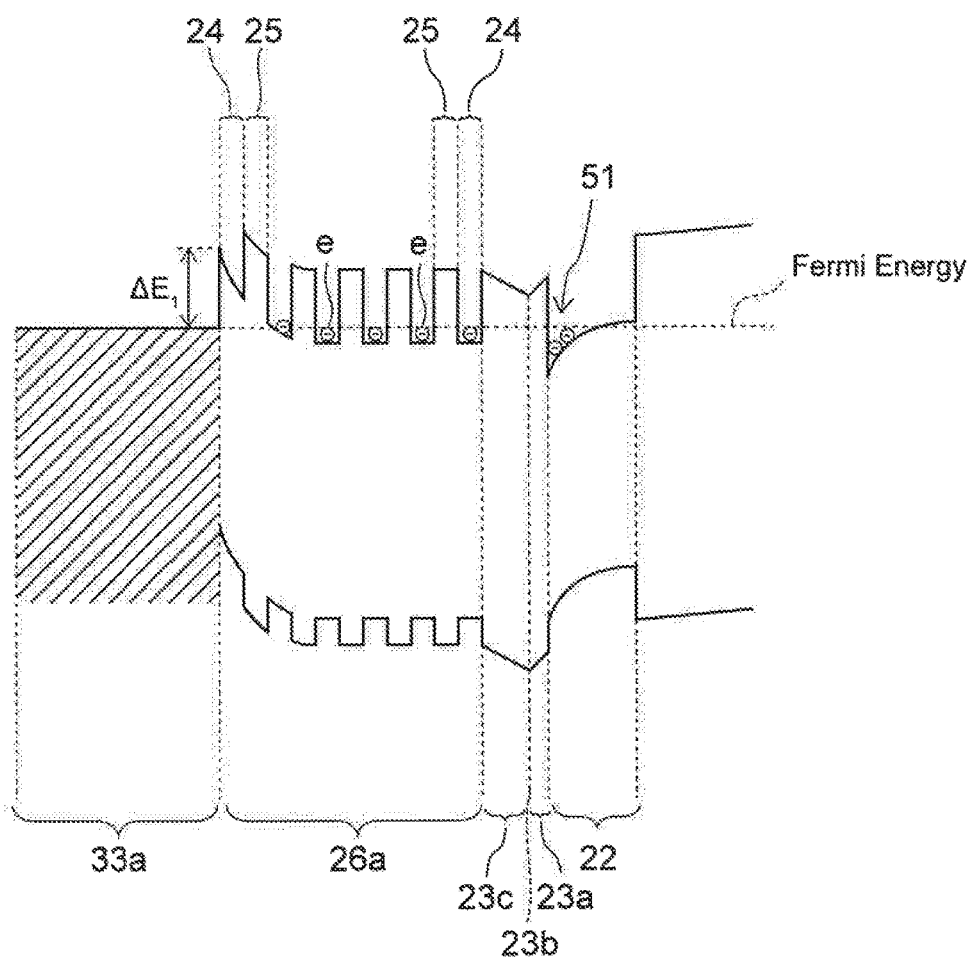
FIG. 7 is a diagram illustrating the band structure of the entire compound semiconductor device according to the first embodiment, taken along the line II-II of FIG. 5M.

FIG. 7 is a diagram illustrating the band structure of the entire compound semiconductor device 50, taken along the line II-II in FIG. 5M.

As illustrated in FIG. 7, in the compound semiconductor device 50, two-dimensional electron gas 51 is generated in the channel layer 22 when the electrons e generated in the electron supply layer 23 reach the channel layer 22.

Then, since the resistance of the first cap layer 26a is reduced at low temperature as described above, the source resistance generated between the source electrode 33a and the channel layer 22 can also be reduced at low temperature.

Especially, in the present embodiment, the first compound semiconductor layer 24, which has a narrower bandgap than the second compound semiconductor layer 25, is provided as the uppermost layer of the first cap layer 26a. Therefore, a barrier $\Delta E_1$ between the first cap layer 26a and the source electrode 33a can be lowered. This allows smooth supply of electrons from the source electrode 33a to the first cap layer 26a, enabling further decrease in the source resistance of the compound semiconductor device 50.

Furthermore, the first compound semiconductor layer 24, which has the narrower bandgap, is provided as the lowermost layer of the first cap layer 26a. Therefore, electron injection from the first cap layer 26a to the electron supply layer 23 is not obstructed by the second compound semiconductor layer 25, which has the wider bandgap. This allows smooth supply of electrons from the first cap layer 26a to the electron supply layer 23, enabling further decrease in the source resistance of the compound semiconductor device 50.

The inventor of the present invention calculated the resistance of the first cap layer 26a according to the present embodiment.

FIG. 8 illustrates the calculation results.

Note that in this calculation, the first cap layer in FIG. 1 was used as a comparative example, and the resistance of the first cap layer 6 was also calculated. As described with reference to FIG. 1, the first cap layer 6 is a single n-type InGaAs layer.

Moreover, the number of the second compound semiconductor layers 25 of the present embodiment is one for the calculation of mobility, and five for the calculation of sheet resistance.

As illustrated in FIG. 8, electron mobility at room temperature (300K) is 2,000 cm²/Vs in the comparative example and is 10,000 cm²/Vs in the present embodiment. Thus, it was revealed that the present embodiment has higher mobility even at room temperature.

Note that in the comparative example, electron mobility at extremely low temperature (4K) is 2,500 cm²/Vs, which is higher than the value 2,000 cm²/Vs at room temperature (300K).

On the contrary, in the present embodiment, electron mobility at extremely low temperature (4K) is 60,000 cm²/Vs. Thus, it was revealed that increase from the mobility at room temperature (10,000 cm²/Vs) greatly increases than that in the comparative example.

The sheet resistance at room temperature (300K) is substantially the same in the present embodiment and the comparative example.

However, the sheet resistance at extremely low temperature (4K) is 10.4 Ω/square in the present embodiment, which is lower than that in the comparative example (49.9 Ω/square).

The percentage of the ratio of the sheet resistance at room temperature (300K) to the sheet resistance at extremely low temperature (4K) is approximately 80% in the comparative example, whereas it is 17% in the present embodiment, which is markedly smaller than that of the comparative example.

It was confirmed by the above results that the superlattice structure of the first cap layer 26a as in the present embodiment is effective for reducing the resistance of the first cap layer 26a at extremely low temperatures such as 4K.

Since resistance can be reduced at extremely low temperature in this manner, the compound semiconductor device 50 according to the present embodiment produces low noise at extremely low temperature. Thus, when using the compound semiconductor device 50 for an amplifier of a radio telescope for example, observation results with very little noise can be obtained by cooling the compound semiconductor device 50 down to extremely low temperature.

Second Embodiment

In the present embodiment, the resistance of the first cap layer 26a is further reduced as follows.

FIGS. 9A to 9E are sectional views of a compound semiconductor device in the course of manufacturing thereof according to the present embodiment. Note in FIGS. 9A to 9E that the same elements as those in the first embodiment are denoted by the same reference numerals as in the first embodiment, and their explanations are omitted below.

Figure 9A:
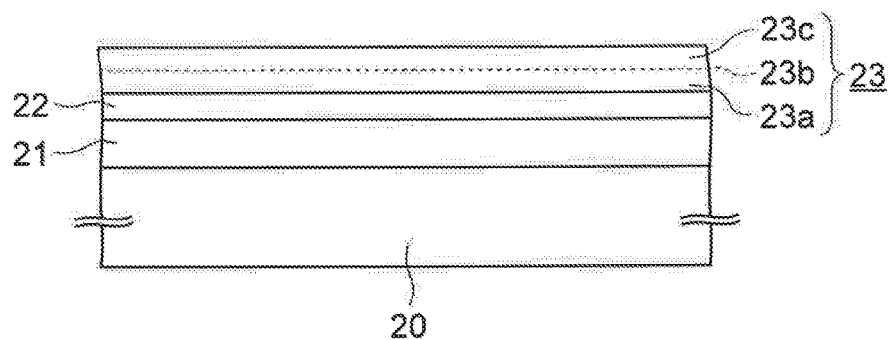
FIGS. 9A to 9E are sectional views of a compound semiconductor device in the course of manufacturing thereof according to a second embodiment.

First, as illustrated in FIG. 9A, by performing the steps of FIGS. 5A and 5B of the first embodiment, a structure in which the buffer layer 21, the channel layer 22, and the electron supply layer 23 are stacked in this order on the substrate 20 is formed.

Figure 9B:
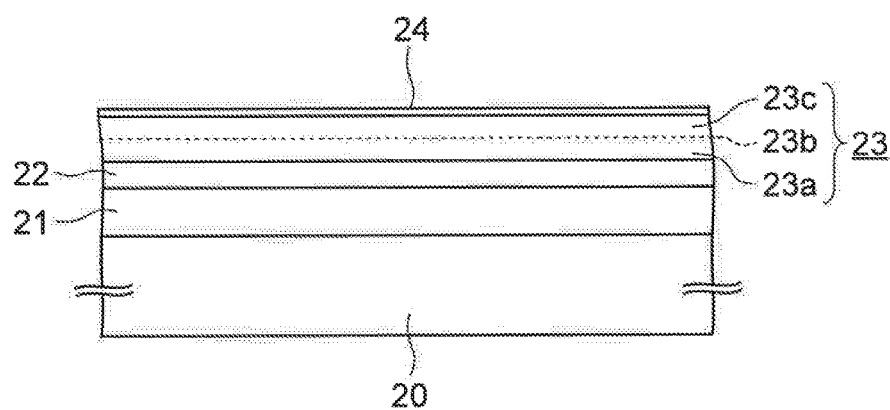

Then, as illustrated in FIG. 9B, the i-type first compound semiconductor layer 24 is formed on the electron supply layer 23 to a thickness of about 5 nm.

The first compound semiconductor layer 24 is an i-type InGaAs layer formed by MOCVD method as in the first embodiment.

Figure 9C:
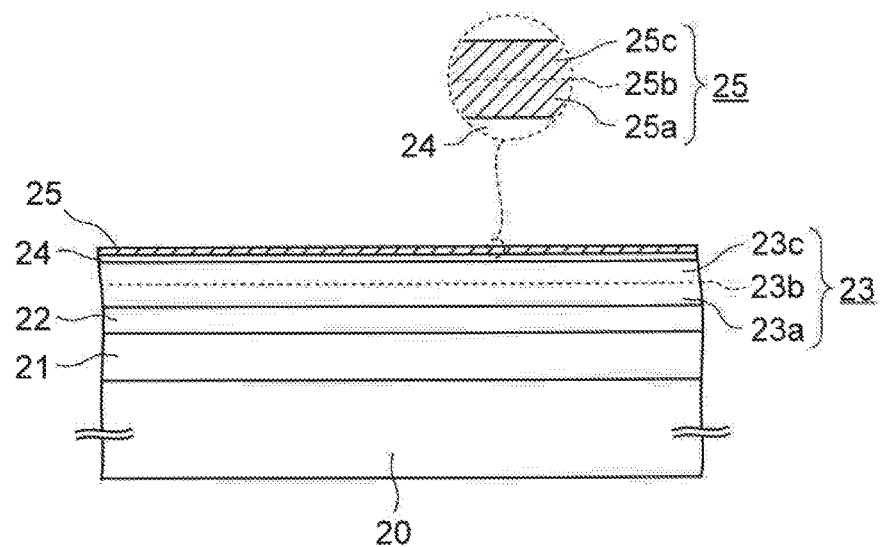

Next, a description is given of the step illustrated in FIG. 9C.

First, growth gas for an InAlAs is supplied to the unillustrated chamber used for the formation of the first compound semiconductor layer 24. Thus, an i-type InAlAs layer is formed on the first compound semiconductor layer 24 by MOCVD method to a thickness of about 2.5 nm as a lower layer 25a of the second compound semiconductor layer 25.

As described in the first embodiment, the growth gas for the InAlAs layer includes trimethylindium or triethylindium as the material gas for In. The growth gas also includes trimethylaluminum or triethylaluminum as the material gas for Al. Further, the growth gas includes arsine for the material gas for As.

Then, the supply of the growth gas to the chamber is temporally stopped, and then the chamber is supplied with a material gas for silicon such as silane and disilane, thereby exposing the surface of the lower layer 25a to the material gas for silicon. Thus, an n-type doped layer 25b is formed in the surface of the lower layer 25a by planar doping. The doped layer 25b is doped with silicon as n-type impurities with a concentration of about $5\times10^{12}$ cm$^{-2}$.

Thereafter, the growth gas for the InAlAs layer is again supplied to the chamber, thereby forming an i-type InAlAs layer on the doped layer 25b to a thickness of about 2.5 nm as an upper layer 25c by MOCVD method.

By these steps, the second compound semiconductor layer 25 in which the n-type impurities are localized in the doped layer 25b famed at the interface between the lower layer 25a and the upper layer 25c is obtained.

Figure 9D:
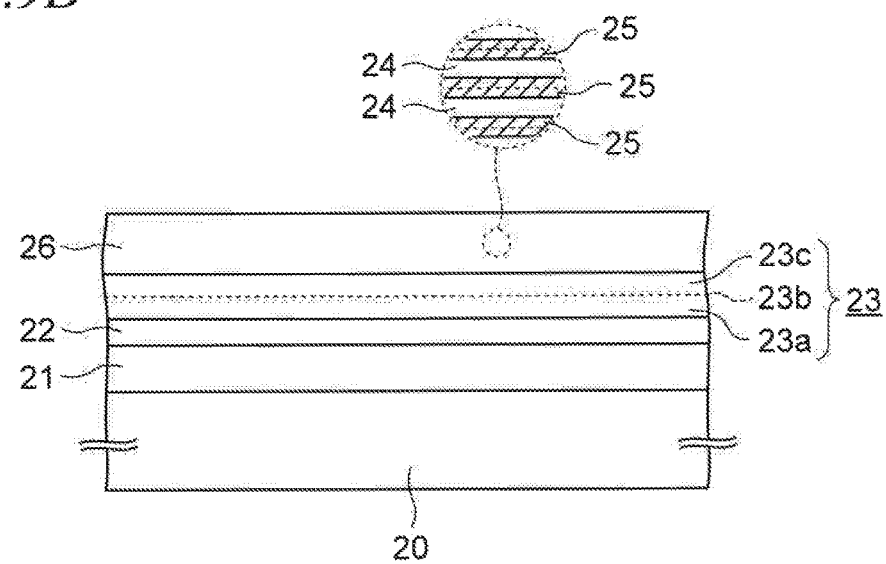

Next, as illustrated in FIG. 9D, the above first compound semiconductor layers 24 and the second compound semiconductor layers 25 are alternately stacked to form the stacked film 26.

Figure 9E:
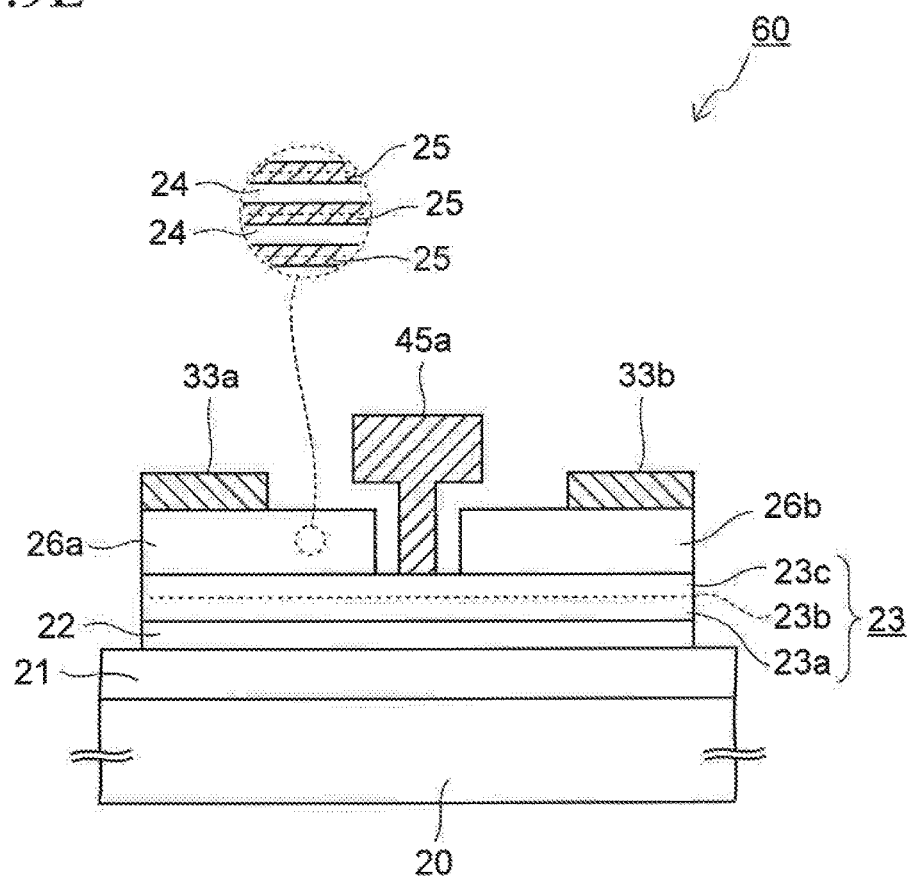

After that, as illustrated in FIG. 9E, by performing the steps of FIGS. 5D to 5M described in the first embodiment, the basic structure of a compound semiconductor device 60 according to the present embodiment is completed.

According to the present embodiment described above, as depicted in FIG. 9C, the second compound semiconductor layer 25 has a stacked structure of the lower layer 25a and the upper layer 25c which are both i-type, and the n-type impurities are localized in the doped layer 25b that are formed at the interface between the lower layer 25a and the upper layer 25c.

Figure 10A:
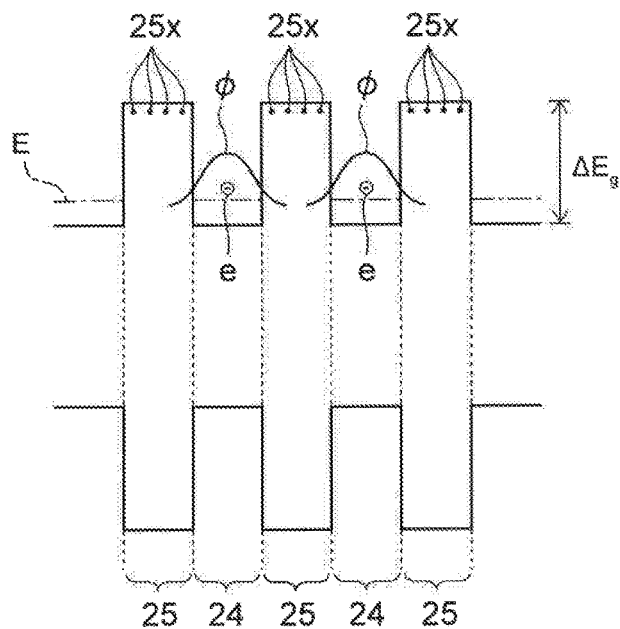
FIG. 10A is a diagram illustrating the energy band structure of the first cap layer according to the first embodiment.
Figure 10B:
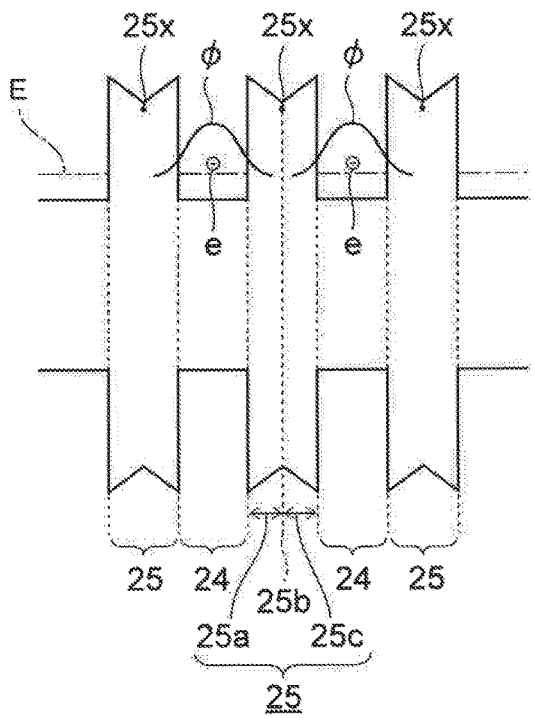
FIG. 10B is a diagram illustrating the energy band structure of a first cap layer according to the second embodiment.

FIG. 10A is a diagram illustrating the energy band structure of the first cap layer 26a according to the first embodiment, and FIG. 10B is a diagram illustrating the energy band structure of the first cap layer 26a according to the present embodiment.

As illustrated in FIG. 10A, since the bandgap difference $\Delta E_g$ between the compound semiconductor layers 24 and 25 is finite, the tails of the wave function φ of the electron e overlap with the second compound semiconductor layers 25. Thus, the electrons e exist in the second compound semiconductor layers 25 with a certain probability. In the first embodiment, the electrons in the second compound semiconductor layer 25 are scattered due to the n-type impurities 25x uniformly distributed over the second compound semiconductor layer 25.

On the contrary, in the present embodiment as illustrated in FIG. 10B, the tail of the wave function φ of the electron e overlaps with the second compound semiconductor layers 25 as well for the aforementioned reason. Thus, the electrons e exist in the second compound semiconductor layers 25 with a certain probability.

However, since the n-type impurities 25x are localized at the interface between the lower layer 25a and the upper layer 25c in the present embodiment, the tail of the wave function φ of the electron e is less likely to overlap with the n-type impurities 25x Hence, the electrons e existing in the second compound semiconductor layer 25 are less likely to be scattered due to the n-type impurities 25x, which makes it possible to increase the mobility of the electrons in the first cap layer 26a than the first embodiment.

Especially, when the lower layer 25a and the upper layer 25c have the same film thickness, the n-type impurities 25x can be equally positioned away from the wave functions φ on both sides of the second compound semiconductor layer 25. As a result, the electrons e existing in both the upper surface and the lower surface of the second compound semiconductor layer 25 are less likely to be scattered due to the n-type impurities 25x, which makes it possible to further increase the electron mobility.

Third Embodiment

In the present embodiment, the source resistance is further reduced as follows.

Figure 11A:
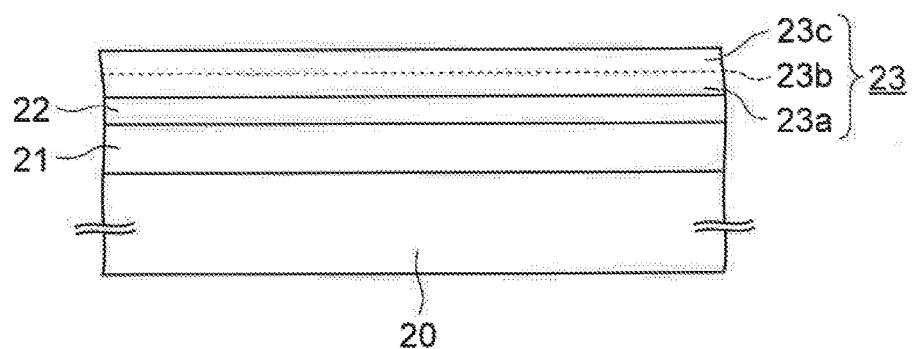
FIGS. 11A to 11C are sectional views of a compound semiconductor device in the course of manufacturing thereof according to a third embodiment.
Figure 11B:
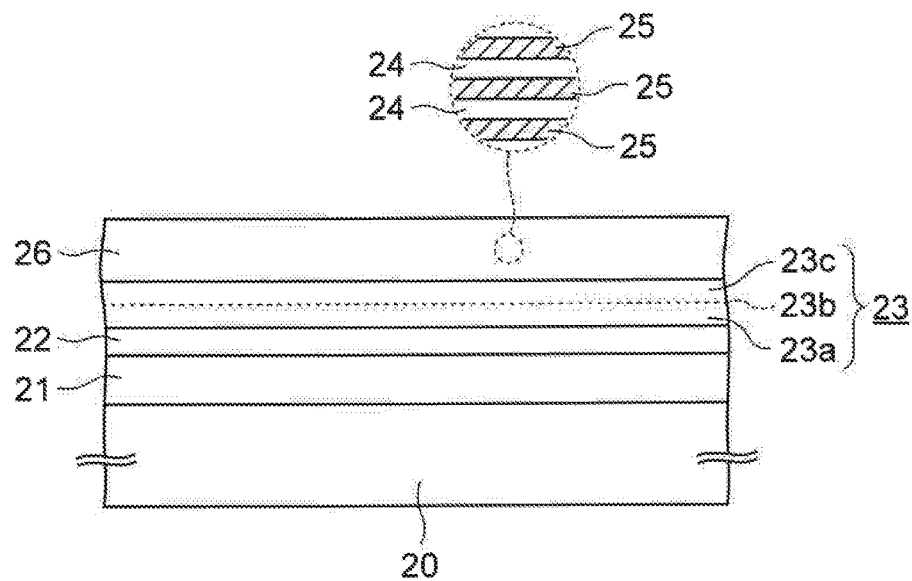
Figure 11C:
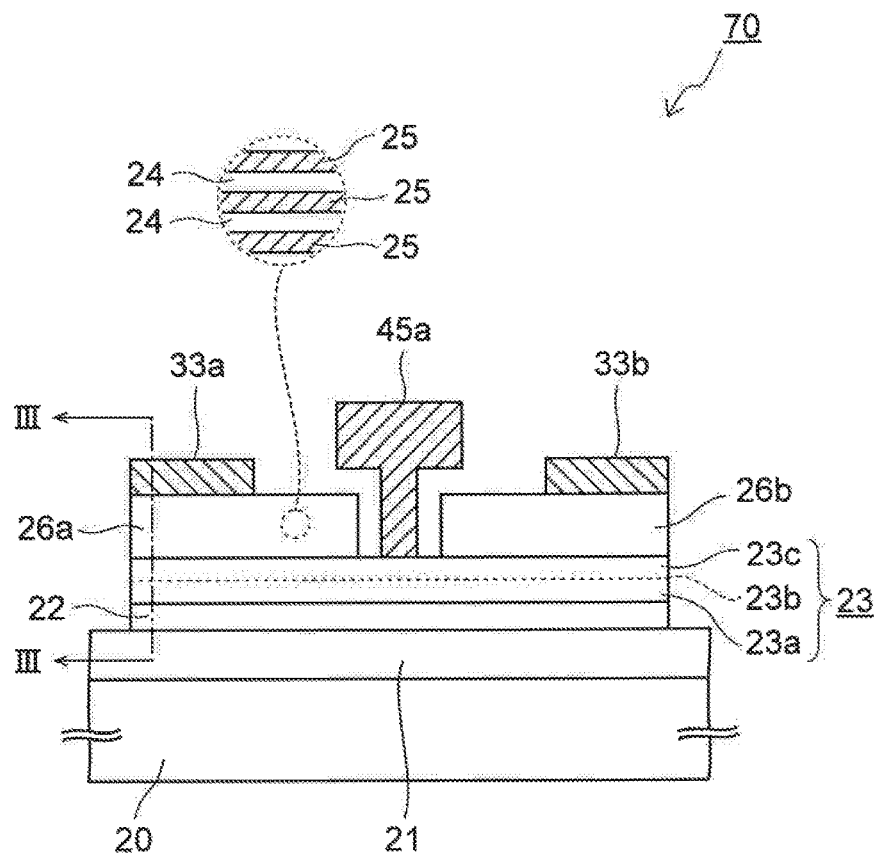

FIGS. 11A to 11C are sectional views of a compound semiconductor device in the course of manufacturing thereof according to the present embodiment. Note in FIGS. 11A to 11C that the same elements as those in the first embodiment are denoted by the same reference numerals as in the first embodiment, and their explanations are omitted below.

First, as illustrated in FIG. 11A, by performing the steps of FIGS. 5A and 5B in the first embodiment, a structure in which the buffer layer 21, the channel layer 22, and the electron supply layer 23 are stacked in this order on the substrate 20 is formed.

Next, as illustrated in FIG. 11B, by alternately switching growth gases in the same chamber that is used for forming the electron supply layer 23, the i-type first compound semiconductor layers 24 and the n-type second compound semiconductor layers 25 are alternately stacked to form the stacked film 26.

Of these compound semiconductor layers, the i-type first compound semiconductor layer 24 is InGaAs layer with the thickness of 5 nm.

Moreover, the n-type second compound semiconductor layer 25 is, as in the first embodiment, InAlAs layer with the thickness of 5 nm, in which silicon is doped with a concentration of about $1\times10^{19}$ cm$^{-2}$ as n-type impurities.

However, the Al composition ratio in the InAlAs layer is made lowered toward the uppermost layer of the stacked film 26 in the present embodiment, thereby making bandgap of the second compound semiconductor layer 25 narrower toward the uppermost layer of the stacked film 26. In order to reduce the Al composition ratio in this manner, the flow rate ratio of the material gas for Al, such as trimethylaluminum and triethylaluminum, in the growth gas for the second compound semiconductor layer 25 may be lowered.

In this example, the stacked film 26 includes five second compound semiconductor layers 25. Among these layers, the first to third compound semiconductor layers 25 from the uppermost layer are made of $In_{0.65}Al_{0.35}As$, $In_{0.60}Al_{0.40}As$, and $In_{0.55}Al_{0.45}As$, respectively. Then, the remaining two second compound semiconductor layers 25 are all made of $In_{0.52}Al_{0.48}As$.

Thereafter, by performing the steps of FIGS. 5D to 5M described in the first embodiment, the basic structure of a compound semiconductor device 70 according to the present embodiment is completed, as illustrated in FIG. 11C.

According to the present embodiment described above, the bandgaps of the second compound semiconductor layers 25 in the first cap layer 26a are made narrower toward the uppermost layer of the first cap layer 26a.

Figure 12:
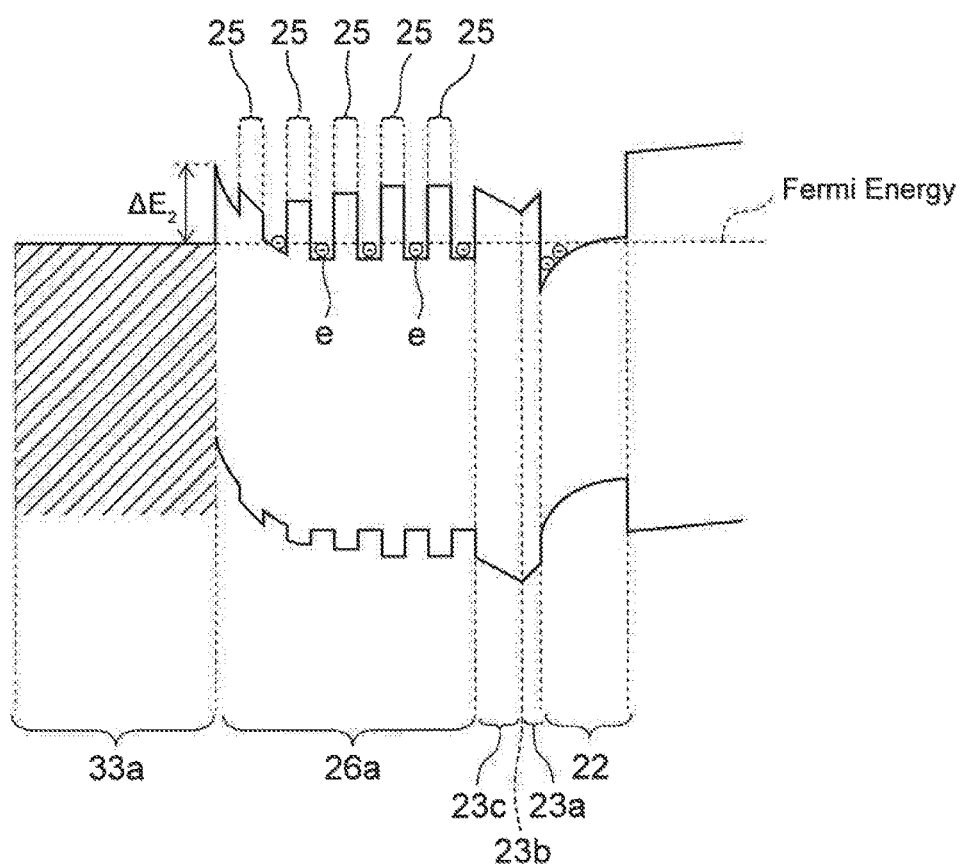
FIG. 12 is a diagram illustrating the band structure of the entire compound semiconductor device according to the third embodiment, taken along the line III-III of FIG. 11C.

FIG. 12 is a diagram illustrating the band structure of the entire compound semiconductor device 70 taken along the line in FIG. 11C.

As illustrated in FIG. 12, as the result of making the bandgaps of the second compound semiconductor layers 25 in the first cap layer 26a narrower toward the uppermost layer of the first cap layer 26a, the height $\Delta E_2$ of the barrier between the source electrode 33a and the uppermost second compound semiconductor layer 25 can be reduced.

As a result, the ohmic contact resistance generated between the source electrode 33a and the first cap layer 26a is reduced, thereby making it possible to further reduce the source resistance.

Note that although the n-type second compound semiconductor layer 25 is uniformly doped with the n-type impurities in the above, the n-type second compound semiconductor layer 25 may be doped with n-type impurities by planar doping as in the second embodiment.

Other Embodiments

In the first to third embodiments, the InP HEMT is manufactured as the compound semiconductor device. However, the materials for the layers in the InP HEMT are not limited to the above. Further, the compound semiconductor device is not limited to the InP HEMT.

In the present embodiments, variations of the compound semiconductor device and the materials for its layers are described.

<InP HEMT>

FIG. 13 is a diagram illustrating another example of materials for the layers of an InP HEMT that is manufactured as the compound semiconductor device in the same process as in the first to third embodiments.

As illustrated in FIG. 13, the first compound semiconductor layer 24 may be made of i-type InAs, instead of i-type InGaAs described in the first embodiment. In this case, the second compound semiconductor layer 25 may be formed of either n-type InAlAs or n-type InGaAs.

<GaN HEMT>

FIG. 14 is a diagram illustrating an example of materials for the layers of a GaN HEMT manufactured as the compound semiconductor device.

A GaN HEMT is an HEMT having a GaN layer as the channel layer 22. In this case, a GaN substrate may be used as the substrate 20, and n-type AlGaN may be used as the material for the electron supply layer 23. Moreover, the first compound semiconductor layer 24 may be, for example, i-type InGaN, and the second compound semiconductor layer 25 may be n-type GaN or n-type AlGaN.

<GaAs HEMT>

FIG. 15 is a diagram illustrating an example of materials for the layers of a GaAs HEMT manufactured as the compound semiconductor device.

A GaAs HEMT is an HEMT having a GaAs layer as the channel layer 22. In this case, a GaAs substrate may be used as the substrate 20, and n-type AlGaAs may be used as the material for the electron supply layer 23. Moreover, the first compound semiconductor layer 24 may be, for example, i-type GaAs or i-type InGaAs, and the second compound semiconductor layer 25 may be n-type AlGaAs.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a substrate;
a channel layer foiled over the substrate;
an electron supply layer formed on the channel layer;
a first cap layer and a second cap layer formed at a distance from each other on the electron supply layer;
a source electrode famed on the first cap layer;
a drain electrode formed on the second cap layer; and
a gate electrode formed on the electron supply layer between the first cap layer and the second cap layer, wherein
each of the first cap layer and the second cap layer is a stacked film formed by alternately stacking i-type first compound semiconductor layers and n-type second compound semiconductor layers having a wider bandgap than the first compound semiconductor layers,
the electron supply layer includes:
a spacer layer of an i-type third compound semiconductor formed on the channel layer;
an n-type doped layer formed on the spacer layer; and
a barrier layer of the i-type third compound semiconductor formed on the n-type doped layer, and
a Schottky barrier is formed between the barrier layer and the gate electrode.

2. The compound semiconductor device according to claim 1, wherein
the second compound semiconductor layer includes:
a lower layer made of an i-type compound semiconductor, and
an upper layer formed on the lower layer and made of the i-type compound semiconductor, wherein
n-type impurities are localized at an interface between the lower layer and the upper layer.

3. The compound semiconductor device according to claim 2, wherein
the lower layer and the upper layer have the same thickness.

4. The compound semiconductor device according to claim 1, wherein
the bandgap of each of the second compound semiconductor layers becomes narrower toward an uppermost layer of the stacked film.

5. The compound semiconductor device according to claim 1, wherein
an uppermost layer of the stacked film is the first compound semiconductor layer.

6. The compound semiconductor device according to claim 1, wherein
a lowermost layer of the stacked film is the first compound semiconductor layer.

7. A method of manufacturing a compound semiconductor device, the method comprising:
forming a channel layer over a substrate;
forming an electron supply layer on the channel layer;
alternately forming i-type first compound semiconductor layers and n-type second compound semiconductor layers having a wider bandgap than the first compound semiconductor layers on the electron supply layer to form a stacked film of the first compound semiconductor layers and the second compound semiconductor layers;
patterning the stacked film to form a first cap layer and a second cap layer at a distance from each other;
forming a source electrode on the first cap layer;
forming a drain electrode on the second cap layer; and
forming a gate electrode on the electron supply layer between the first cap layer and the second cap layer, wherein the electron supply layer includes:
a spacer layer of an i-type third compound semiconductor formed on the channel layer;
an n-type doped layer formed on the spacer layer; and
a barrier layer of the i-type third compound semiconductor formed on the n-type doped layer, and
a Schottky barrier is formed between the barrier layer and the gate electrode.

8. The method of manufacturing a compound semiconductor device according to claim 7, wherein
the forming of the second compound semiconductor layers includes:
forming a lower layer made of an i-type compound semiconductor,
exposing a surface of the lower layer to a gas containing an n-type impurity, and
after exposing the surface of the lower layer to the gas, forming an upper layer made of the i-type compound semiconductor on the surface to make the lower layer and the upper layer into the second compound semiconductor layer.

9. The method of manufacturing the compound semiconductor device according to claim 7, wherein
the lower layer and the upper layer have the same thickness.

* * * * *